United States Patent [19]

Ueno et al.

[11] Patent Number: 5,143,593
[45] Date of Patent: Sep. 1, 1992

[54] METHOD OF COPPER PLATING

[75] Inventors: Kenichi Ueno; Kazuhiro Hirao; Genzo Yamane, all of Kanagawa, Japan

[73] Assignee: Permelec Electrode Ltd., Kanagawa, Japan

[21] Appl. No.: 716,870

[22] Filed: Jun. 18, 1991

[30] Foreign Application Priority Data

Jun. 20, 1990 [JP] Japan .................. 2-162192

[51] Int. Cl.$^5$ .................. C25D 3/38; C25D 5/54; C25D 21/14
[52] U.S. Cl. .................. 205/291; 204/275; 205/125; 205/292; 205/920
[58] Field of Search .............. 205/125, 292, 291, 296, 205/920; 204/275, 252

[56] References Cited

U.S. PATENT DOCUMENTS

| | | | |
|---|---|---|---|
| 3,769,179 | 10/1973 | Durose et al. | 205/920 |
| 4,469,564 | 9/1984 | Okinaka et al. | 205/125 |
| 4,518,465 | 5/1985 | Morimoto et al. | 205/920 |

FOREIGN PATENT DOCUMENTS 297884 11/1989 Japan .

OTHER PUBLICATIONS

Chemical Abstracts, vol. 85, No. 26, 1976, p. 446; abstract No. 184092r.

Primary Examiner—John Niebling
Assistant Examiner—Brian M. Bolam
Attorney, Agent, or Firm—Sughrue, Mion, Zinn, Macpeak & Seas

[57] ABSTRACT

A method of copper-plating a material whereby electrolysis is performed using an electrolytic plating cell including a diaphragm which separates an anode chamber having therein an insoluble metal electrode as an anode from a cathode chamber having therein the material to be plated as a cathode, and further using an electrolyte solution containing copper ions and an additive, wherein the electrolyte is fed to the cathode chamber in a manner such that the copper ion concentration in the electrolyte within the cathode chamber is kept constant and electrolyte is further fed to the anode chamber at a rate of from about 0.2 to 11 ml/KAh.

10 Claims, 1 Drawing Sheet

METHOD OF COPPER PLATING

FIELD OF THE INVENTION

The present invention relates to a method for efficiently performing electrolytic copper plating of a material such as a printed-circuit substrate.

BACKGROUND OF THE INVENTION

In a printed-circuit substrate having a copper foil layer on both sides, an electrical connection between a circuit portion of the front side and that of the back side is typically established by forming a through-hole in the desired position and copper-plating the inner wall of the through-hole. The through-hole plating is accomplished by activating the printed-circuit substrate with a palladium-containing bath, and next electrolessly copper-plating the exposed surfaces of the printed-circuit substrate to deposit a thin copper layer, and then performing electrolytic copper plating.

As a technique of electrolytically copper plating a printed-circuit substrate using an insoluble metal electrode, a copper plating method has been proposed in which an insoluble metal anode is separated from a cathode which is the substrate material to be plated, e.g., a printed-circuit substrate, by a diaphragm. Electrolysis is performed in the cathode chamber using an electrolyte solution containing copper ions and an additive, thereby plating the surfaces of the substrate material, including the wall of the through-hole (e.g., see JP-A-1-297884; the term "JP-A" as used herein means an "unexamined published Japanese patent application").

According to this proposed method, the anode solution may be an electrolyte which differs from the plating or cathode solution and contains no copper ions. That is, entirely different types of electrolytes may be used as the anode and cathode solutions, respectively. In this case, however, the use of different electrolytes results in an increased osmotic pressure over the diaphragm, and this causes a difference in liquid level to development in a relatively short period of time between the anode and cathode solutions and poses other problems. In order to remove such problems, complicated equipment must be used which, for example, includes two circulating pumps installed separately for the two electrolyte solutions. This circumstance leads to increased equipment costs.

On the other hand, in the case of using the same type of plating solution for both the anode and cathode solutions, a maintenance problem arises. Specifically, in order to prevent the additive contained in the plating solution from being consumed on the insoluble metal anode, the anode chamber is first filled with the electrolyte and feeding of the electrolyte to the anode chamber from the cathode chamber is then suspended, and thereafter replenishment is done intermittently according to need.

Although electrolyte replenishment of the anode chamber may be attained by means of osmosis from the cathode chamber to anode chamber through the diaphragm, this is not a reliable method over an extended period of operating time because clogging of the diaphragm and other troubles may occur.

There is no known permanent expedient which prevents consumption of the additive in the electrolyte solution by the insoluble anode and also corrects for a reduction in the amount of anode solution due to the electrolysis or evaporation of water in the anode chamber.

SUMMARY OF THE INVENTION

An object of the present invention is to provide a method of copper plating which eliminates the disadvantages of the above-described conventional techniques, and which can avoid defective plating attributable to a reduction in anode solution amount and also can minimize the consumed amount of the plating additive.

The present invention provides a method of copper-plating a material which comprises performing electrolysis using an electrolytic plating cell which has been separated by a diaphragm into an anode chamber having therein an insoluble metal electrode as an anode, and a cathode chamber having therein the material to be plated as a cathode, and further using as an electrolyte a solution containing copper ions and an additive (described hereinafter). Further, the electrolyte is fed to the cathode chamber in a manner such that the copper ion concentration in the electrolyte within the cathode chamber is kept constant and further being fed to the anode chamber at a rate of from about 0.2 to 11 ml/KAH.

DETAILED DESCRIPTION OF THE INVENTION

Figure 2:
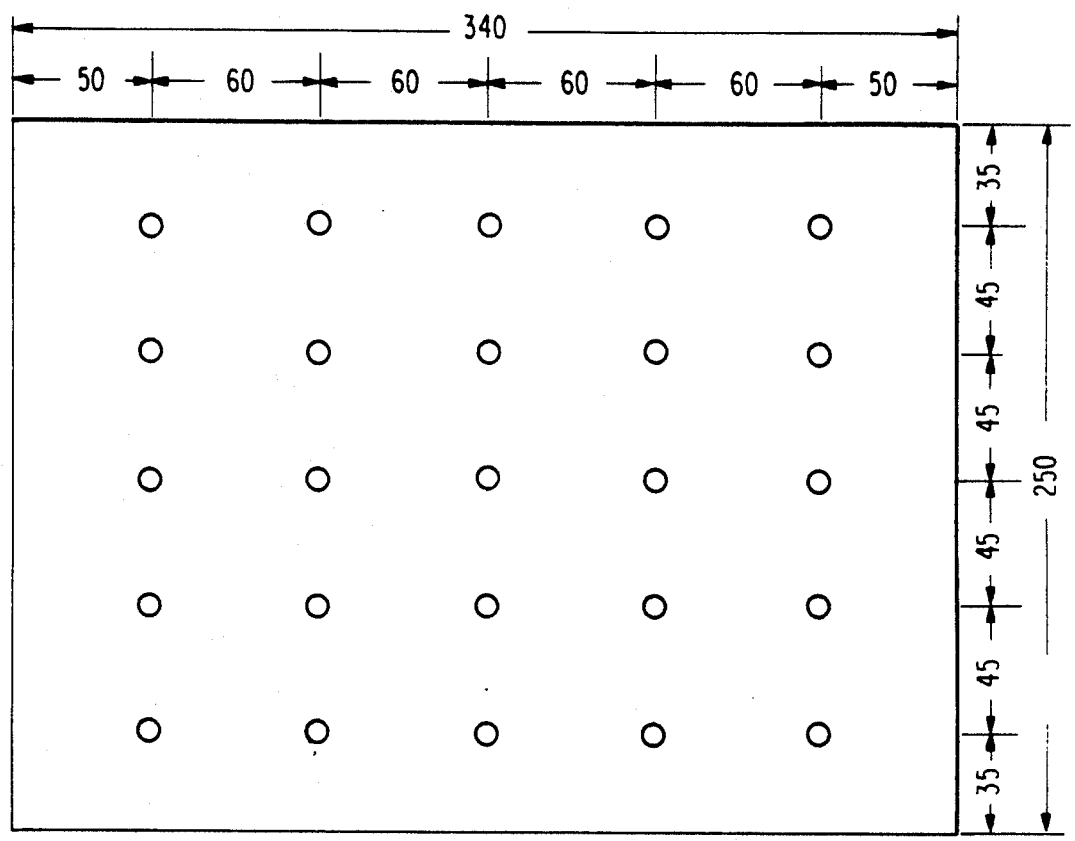
FIG. 2 is a view showing deposited copper thickness-measuring points for materials plated in the Examples.

The copper plating method of the present invention is characterized in that in order to avoid defective plating attributable to a reduction in anode solution amount while minimizing the amount of an additive consumed on the insoluble anode during electrolytic copper plating, an electrolyte which is the same as that fed to the cathode chamber and contains copper ions and an additive is fed to the anode chamber in the electrolytic cell in a very small amount or in a minimum required amount.

In the method of the present invention, the anode can, for example, be a so-called DSE electrode which is an insoluble metal electrode obtained by coating a titanium substrate or other substrate with a platinum group metal oxide or a mixed oxide containing platinum group metal oxide. This DSE electrode has an anode voltage (oxygen-evolving voltage) about 1,000 mV higher than those of soluble electrodes. However, since such an anode voltage is 500–800 mV lower than those of electrodes formed by coating platinum group metals to substrates and of lead electrodes, the DSE electrode can effectively prevent the decomposition of additives to some degree. In spite of the above, a platinum group metal-coated electrode or lead electrode may also be used in the method of the present invention as an anode. The anode used in the present invention can be in any form, such as a perforated, plate, or rod form or the form of a box whose upper part can be opened. Installation of the anode in an electrolytic cell may be accomplished by providing a bus bar which extends upward from the bottom of the cell and connecting the anode with the bus bar, as in ordinary electrolytic cells for common salt, or by placing a beam which extends from one upper edge of the electrolytic cell to another and hanging from the beam a bus bar which is in the shape of, for example, an inverted letter "J" and with which the anode has been connected.

The cathode is the material to be plated, which preferably is a printed-circuit substrate. This printed-circuit substrate, for example, is a composite board comprising a synthetic resin base material and a thin copper foil covering the base material and having a plurality of through-holes in predetermined positions. It is preferred that before the material to be plated is subjected to electroplating according to the method of the present invention, a thin copper layer be formed on the surfaces of the material by chemical plating for the purpose of smoothly conducting the electroplating. Although the material to be plated is normally a board of about 30 cm × 30 cm, it is preferred in the present invention that a plurality of such materials to be plated be arranged side by side in the vertical and horizontal directions to form a large plane board and this large board be placed in the electrolytic cell by means of a predetermined jig, so that a large number of the materials are plated simultaneously in a single operation.

The diaphragm used preferably is one which can inhibit permeation of an additive almost completely. In most cases, the additive contained in the electrolyte is present not in an ionic state but in a colloidal state, and it is thought that the diameters of such additive particles, which are agglomerates of primary particles or are surrounded by water molecules, are from several micrometers to several tens of micrometers. It is therefore desirable that the diaphragm should have opening sizes or aperture sizing of 10 $\mu$m or less. The material of the diaphragm is not particularly limited, but an ion-exchange membrane is most advantageous from the standpoints of impermeability to electrolyte and resistance loss. Also, other known organic polymer membrane made of, for example, PTFE, polyethylene/polyvinyl chloride, etc., can be used.

For the purpose of feeding a sufficient amount of copper ions to the surfaces of the material to be plated and removing gases generated in the cathode chamber, it is preferred in the present invention to agitate the electrolyte by sending air thereinto.

The electrolytic cell used in the present invention may be a newly constructed one. Alternatively, an electrolytic cell which has been used with conventional soluble anodes may be modified or retrofitted so as to be suitable for use in the present invention. This modification can be accomplished by a relatively simple procedure, specifically by replacing the soluble anode with an insoluble metal electrode or the like, separating the anode and cathode by a diaphragm, and providing a line for feeding an electrolyte containing copper ions and an additive to the anode chamber from a supply outside the chamber.

It is conventional to use an additive in the plating technique. The additive is used to improve various purposes and functions, such as improvement of throwing powder (uniform adhesion), improvement of plating quality, improvement of surface smoothness, and the like. The additive used in the present invention is used in the same purposes as in the above-described conventional technique.

Examples of the additive contained in the electrolyte used in the present invention include polyethers such as 1,3-dioxolan polymer, poly(propylene glycol), and poly(propylene propanol), organosulfur compounds, nitrogen compounds such as phenazone dyes, and the like.

Electrolysis conditions such as electric current concentration, applied voltage, electric current density, and electrolyte temperature may be the same as those in conventional electrolytic copper plating methods. For example, the electric current concentration is regulated at about 0.1–3.0 A/l, applied voltage 1.5–6.0 V, anode electric current density 1–10 A/dm$^2$, cathode electric current density 1–10 A/dm$^2$, and electrolyte temperature 15°–35° C.

For the purpose of maintaining the copper ion concentration constant in the electrolyte within the cathode chamber, replenishment with copper ions is preferably performed by dissolving in an electrolyte a suitable copper compound, e.g., copper carbonate, along with an additive such as described above in an amount equal to the deficient amount in the cathode chamber and feeding all or substantially all of the resulting replenishment electrolyte to the cathode chamber in the electrolytic cell. Likewise, electrolyte feeding to the anode chamber may be effected in an amount sufficient for replenishing the amount reduced by the electrolysis or evaporation of water therein. This feeding may be conducted indirectly by permeation through the diaphragm and directly via natural circulation through a larger pore provided through a wall of an anode structure which separates anode and cathode chambers of the cell, but may, of course, be effected directly in the simultaneous manner.

In the latter-mentioned case, if the rate of electrolyte feeding to the anode chamber, which feeding is effected directly or indirectly from the cathode chamber through the diaphragm or a pore provided in an anode chamber wall, respectively, is below about 0.2 ml/KAh, the electrolyte amount which is lost during electrolysis in the anode chamber cannot be sufficiently replenished. If the feeding rate exceeds about 11 ml/KAh, the amount of decomposed additive is increased, causing the necessity of an increased amount of replenishment with the relatively expensive additive. It is therefore preferred in the copper plating method of the present invention that the rate of electrolyte feeding to the anode chamber be from about 0.2 to 11 ml/KAh. Also, when copper plating is conducted at an electrolyte-feeding rate within the above range, defective plating such as unevenness in deposited copper thickness due to an insufficiency of electrolyte amount in the anode chamber can be avoided and the additive can be prevented from being consumed in an unnecessarily large amount by decomposition.

Figure 1:
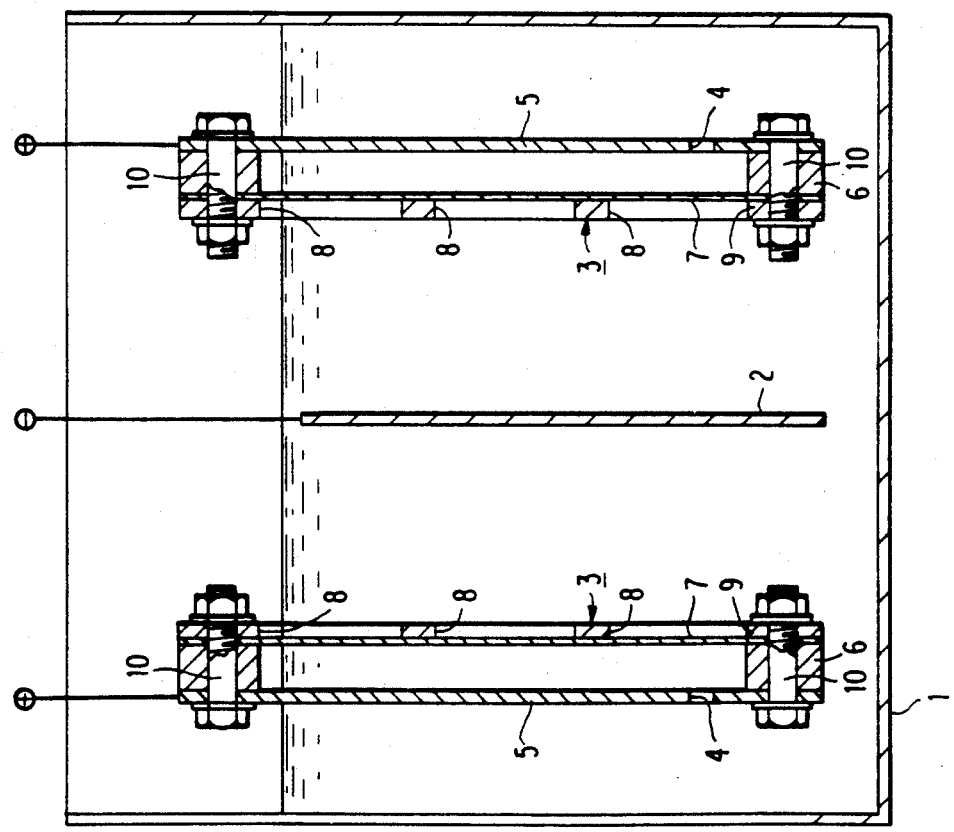
FIG. 1 is an exploded perspective view of an electrolytic cell which can be used in the copper plating method of the present invention.

FIG. 1 is a vertical sectional view illustrating an electrolytic cell which can be used in the method of the present invention.

In the middle of a box-shaped electrolytic cell main body 1 is placed a material to be plated 2, as the cathode, which, for example, is a printed-circuit substrate or the like. On both sides of the material to be plated 2, two anode structures 3 are provided, respectively, at a distance of 10 to 30 cm therefrom. Each anode structure 3 comprises a plane board-shaped insoluble metal anode 5 whose one side facing the material to be plated 2 is covered with a layer of a platinum group metal oxide such as iridium oxide or mixed metal oxide such as iridium oxide and tantalum oxide, and which has an electrolyte-feeding pore 4 in its lower middle part, and further comprises a picture frame-shaped gasket 6 in close contact with the covering side of the anode 5, a sheet-form diaphragm 7 in close contact with the gasket 6, and a frame 9 which is in close contact with the diaphragm 7 and has a plurality of openings 8. These superposed constituent materials are united by means of bolts 10 penetrating bolt holes.

In the electrolytic cell main body 1, an anode chamber is formed which is the space between the insoluble metal anode 5 and the diaphragm 7 in the anode structure 3. The space in the cell other than the anode chamber represents a cathode chamber.

When this electrolytic cell is filled with an electrolyte containing copper ions and an additive and an electric current is applied, copper ions in the electrolyte are reduced on the cathode into copper metal, which is deposited on the cathode, i.e., the material to be plated 2, thereby copper-plating the material 2. Along with this copper plating, electrolysis of water takes place and, as a result, the amount of the anode solution diminishes. However, this reduced amount of the anode solution is replenished by feeding an electrolyte from the cathode chamber through the electrolyte-feeding pore 4 described above, thereby to continually maintain the amount of the anode solution at around a predetermined value. Thus, defective plating and other troubles can be prevented from occurring.

As described above, the copper plating method of the present invention, which comprises conducting electrolysis using as an electrolyte a solution containing copper ions and an additive to copper-plate a material to be plated, is characterized in that the electrolyte is fed to the anode chamber at a rate of from 0.2 to 11 ml/KAh, while electrolyte feeding to the cathode chamber is being properly conducted.

According to the method of the present invention, in order to replenish the electrolyte which is consumed by electrolysis during electrolytic copper plating, a proper amount of an electrolyte is fed to the cathode chamber in the electrolytic cell and a very small portion thereof is fed to the anode chamber thereby to prevent occurrence of defective plating due to poor electric current application, etc., attributable to an insufficiency of the amount of the anode chamber electrolyte. Furthermore, since feeding of a large amount of electrolyte to the anode chamber is not effected, which feeding induces excessive decomposition of the additive, unnecessary feeding of the additive can be avoided and copper plating can be conducted more cost effectively.

The copper plating method of the present invention will be explained below in more detail by reference to examples thereof, which should not be construed as limiting the scope of the invention.

EXAMPLE 1

Two kinds of insoluble metal electrodes, one kind of which had a pore with a pore diameter of 2.0 mm on the surface thereof and the other kind of which had a pore with a pore diameter of 1.0 mm on the surface thereof, and another kind of insoluble metal electrodes which had no pore, were coated on one side with an iridium oxide layer. Using two of such insoluble metal electrodes having the same pore diameter and two electrolytically neutral diaphragms (Yumicron; Trade Name Manufactured by Yuasa Battery Ltd., Japan), anode structures as shown in FIG. 1 were constructed with respect to each kind of insoluble metal electrodes. Since the pores formed in the insoluble metal anodes were open to the cathode chamber, an electrolyte was fed from the cathode chamber to the anode chambers through these pores by means of natural circulation. Between the two anode structures, a glass-epoxy substrate which had previously undergone chemical plating treatment and had a height of 340 mm and a width of 250 mm was placed as a cathode. Likewise, a total of three kinds of electrolytic cells for copper plating as shown in FIG. 1 were constructed. Plating was conducted under the treating conditions shown in Table 1, while the cathode treated was replaced with untreated one and the additive was replenished at 170 ml/KAh according to the applied electric current amount. After plating was repeatedly conducted 100 times, the additive concentration in the electrolyte within the electrolytic cell was determined and the thickness of the deposit on the 100th substrate was measured. This measurement of deposit thickness was effected by the eddy current method at 25 measuring points in the pattern as shown in FIG. 2 on each side of the plated material. Also, in FIG. 2, the plated cathode material is depicted top-to-bottom in the same vertical orientation as suspended in the cell.

The results obtained are shown in Tables 2 to 5. In Tables 3-5, the matrix corresponds to the measuring points as marked in FIG. 2.

TABLE 1

| Plating conditions | |
| --- | --- |
| Electrolyte composition: | |
| $Cu^{2+}$ | 18 g/l |
| $H_2SO_4$ | 180 g/l |
| $Cl^-$ | 60 ppm |
| Additive | 20.3 ml/l |

(Cu Brite-TH; manufactured by
Ebara-Udylite Co., Ltd., Japan; polymer
ingredient analytical value)
Cathode current density  3.0 A/dm²
Plating time  50 min each
Cathode size  250 × 340 mm

TABLE 2

| | Additive concentration in electrolyte and deposit thickness | | | |
| --- | --- | --- | --- | --- |
| Pore diameter (mm) | Rate of feeding to anode chamber (ml/KAh) | Additive concentration in electrolyte (ml/l) | Average of deposit thickness (μm) | Scatter of deposit thickness $\sigma_{n-1}$ (n = 25) |
| 2.0 | 20.9 | 12.5 | 46.4 | 1.3 |
| 1.0 | 5.2 | 23.8 | 46.3 | 1.1 |
| None | 0 | 25.6 | 44.1 | 3.7 |

TABLE 3

| Deposit thickness (pore diameter 2.0 mm, unit μm) | | | | |
| --- | --- | --- | --- | --- |
| (front-towards diaphragm) | | | | |
| 47.5 | 45.4 | 46.8 | 45.3 | 47.2 |
| 48.4 | 44.7 | 46.1 | 44.3 | 48.0 |
| 48.8 | 45.2 | 45.9 | 44.6 | 46.0 |
| 48.0 | 45.5 | 45.5 | 45.4 | 47.4 |
| 46.2 | 47.0 | 45.1 | 47.0 | 46.2 |
| (back-away from diaphragm) | | | | |
| 48.6 | 46.3 | 45.9 | 46.0 | 47.9 |
| 49.5 | 46.1 | 46.4 | 45.5 | 48.9 |
| 47.5 | 45.9 | 45.0 | 45.5 | 47.2 |
| 47.7 | 45.8 | 44.9 | 45.3 | 46.7 |
| 47.6 | 44.6 | 44.9 | 44.7 | 47.2 |

TABLE 4

Deposit thickness
(pore diameter 1.0 mm, unit μm)

(front)

| | | | | |
|---|---|---|---|---|
| 48.2 | 46.6 | 45.7 | 46.6 | 47.9 |
| 46.5 | 45.4 | 45.2 | 45.8 | 47.2 |
| 47.7 | 45.7 | 45.3 | 45.9 | 47.5 |
| 49.0 | 44.9 | 45.4 | 45.5 | 47.0 |
| 47.5 | 45.9 | 44.9 | 45.8 | 47.0 |

(back)

| | | | | |
|---|---|---|---|---|
| 47.2 | 46.3 | 45.3 | 46.4 | 47.7 |
| 47.3 | 46.5 | 45.8 | 46.8 | 48.2 |
| 45.8 | 45.9 | 44.7 | 45.8 | 47.3 |
| 46.0 | 46.4 | 43.5 | 45.5 | 46.7 |
| 45.9 | 46.2 | 44.8 | 45.4 | 46.9 |

TABLE 5

Deposit thickness
(no pore, unit μm)

(front)

| | | | | |
|---|---|---|---|---|
| 38.2 | 37.1 | 36.8 | 36.6 | 37.8 |
| 44.0 | 43.8 | 45.1 | 43.2 | 46.3 |
| 48.2 | 46.7 | 45.6 | 45.8 | 47.2 |
| 47.0 | 46.0 | 45.1 | 45.5 | 47.0 |
| 47.7 | 45.3 | 44.9 | 45.3 | 46.7 |

(back)

| | | | | |
|---|---|---|---|---|
| 39.3 | 37.4 | 36.7 | 36.6 | 38.3 |
| 43.1 | 41.6 | 44.0 | 41.2 | 42.6 |
| 48.8 | 46.7 | 46.1 | 46.4 | 47.8 |
| 47.3 | 45.6 | 44.7 | 45.0 | 46.0 |
| 49.2 | 46.2 | 46.6 | 46.4 | 46.5 |

It can be seen from Table 2 that the larger the pore diameter, the larger the amount of electrolyte fed to the anode chamber and the lower the additive concentration. When electrolyte feeding to the anode chamber is not effected, it is also seen that a larger scatter or variance of deposit thickness results. This is also apparent from Tables 3 to 5. Specifically, in the case of 2.0 mm pore diameter (rate of feeding to anode chamber=20.9 ml/KAh) and 1.0 mm pore diameter (rate of feeding to anode chamber=5.2 ml/KAh), as shown in Tables 3 and 4, respectively, deposit thickness values are well distributed within the relatively narrow ranges of from 44.3 to 49.5 μm and from 44.7 to 49.0 μm, respectively. In contrast, in the case of the insoluble anode electrodes with no pore provided, deposit thickness values vary over the considerably wide range of from 36.6 to 49.2 μm as seen in Table 5, and the deposit thickness is small particularly at higher measuring points. This can be presumed to be attributable to poor electric current application due to the insufficiency of anode chamber electrolyte amount caused by electrolysis.

When the variance of the measured thickness values for the front and back sides as shown in Table 5 is calculated only from the values in the lower three rows for each side without using the values in the upper two rows, the variance $\sigma_{n-1}$ is 1.1, which is substantially or precisely the same as the variance for Tables 3 and 4.

During the plating operation using the insoluble anode electrodes having no pore provided, the deposit thickness results thereof being shown in Table 5, the rate of the decrease in electrolyte amount was measured and, as a result, it was found to be 0.19 ml/KAh.

EXAMPLE 2

Plating of a material was performed under the same conditions as in Example 1 except that insoluble metal electrodes having a pore with a pore diameter of 1.0 mm were used and that the rate of electrolyte feeding to the anode chamber was changed. During the plating, the additive concentration was measured at various electrolyte-feeding rates for the anode chamber. As a result, the electrolyte-feeding rate which caused almost no additive concentration change was found to be 11.8 ml/KAh. From this value and the results shown in Table 2, it can be seen that when the rate of electrolyte feeding to the anode chamber exceeds the value 11.8 ml/KAh, the additive concentration in the electrolyte (plating solution) decreases, while when it is less than that value, the additive concentration increases.

EXAMPLE 3

A titanium plate having a height of 470 mm, a width of 1,100 mm, and a thickness of 3 mm and the lower part of which had undergone ⅜ inch thread cutting was coated on one side with an iridium oxide layer, thereby to prepare an insoluble metal electrode. A rubber gasket, a neutral diaphragm, and a frame made of a vinyl chloride resin were attached to the electrode on its covering side, thereby to construct an anode structure having therein an anode chamber. In order to introduce an electrolyte, a Teflon connector having at its tip a tube made of Teflon (trade name, Vulflon) and having a diameter of 1.0 mm was fitted to the electrode on its uncovered side. The end of the tube was allowed to open to the cathode chamber. Three such anode chambers were grouped to form an anode to be placed on one side of a cathode, and other three were grouped to form an anode to be placed on the other side of the cathode. Fifteen glass-epoxy substrates which had undergone chemical copper plating (both sides having through-holes; copper layer thickness 16 μm; height 340 mm, width 250 mm, thickness 1.6 mm) were fitted into a frame (three substrates in the heightwise direction and five in the widthwise direction) to give a cathode, which was placed between the anodes. An electrolyte having the same composition as that used in Example 1 was fed to the cathode chamber. The rate of electrolyte flow into the anode chamber was 2.4 ml/KAH. Electric current was applied at 3.0 A/dm$^2$ and, as a result, copper was deposited in an amount corresponding to 36 μm. The thickness of the deposited copper layer was measurer on the front and back sides of each of the 15 substrates forming the cathode, at measuring points corresponding top to bottom and side to side to the matrices to Table 6. The average deposit thicknesses and the variance are shown in Table 6 with front and back measurements interposed for convenience sake. The average deposit thicknesses are within the relatively narrow range of from 49.1 to 52.0 μm and the variance $\sigma_{n-1}$ thereof is 1.7. In addition, the plated surfaces were glossy and the plated substrates as products had no defects.

TABLE 6

Deposit thickness (unit μm)

| front | front | front | front | front |
|---|---|---|---|---|
| 51.1 ± 1.4 | 50.5 ± 1.3 | 51.6 ± 0.9 | 52.0 ± 1.3 | 50.3 ± 1.8 |
| (n = 25) | (n = 25) | (n = 25) | (n = 25) | (n = 25) |
| back | back | back | back | back |
| 51.4 ± 1.4 | 52.9 ± 1.3 | 52.6 ± 0.7 | 51.8 ± 1.0 | 52.3 ± 1.3 |
| (n = 25) | (n = 25) | (n = 25) | (n = 25) | (n = 25) |
| front | front | front | front | front |
| 49.5 ± 1.3 | 49.0 ± 1.6 | 50.8 ± 1.1 | 51.1 ± 1.2 | 49.5 ± 1.7 |
| (n = 25) | (n = 25) | (n = 25) | (n = 25) | (n = 25) |
| back | back | back | back | back |
| 49.8 ± 1.1 | 52.2 ± 1.4 | 50.7 ± 1.0 | 49.1 ± 1.4 | 50.6 ± 1.7 |

TABLE 6-continued

| Deposit thickness | | | | |
|---|---|---|---|---|
| | | | | (unit μm) |
| (n = 25) front | (n = 25) front | (n = 25) front | (n = 25) front | (n = 25) front |
| 49.9 ± 1.6 | 49.6 ± 1.5 | 51.1 ± 1.5 | 51.4 ± 1.3 | 50.1 ± 1.8 |
| (n = 25) back | (n = 25) back | (n = 25) back | (n = 25) back | (n = 25) back |
| 49.1 ± 1.2 | 50.4 ± 1.6 | 50.2 ± 1.1 | 49.2 ± 1.0 | 49.9 ± 1.7 |
| (n = 25) | (n = 25) | (n = 25) | (n = 25) | (n = 25) |

While the invention has been described in detail and with reference to specific embodiments thereof, it will be apparent to one skilled in the art that various changes and modifications can be made therein without departing from the spirit and scope thereof.

What is claimed is:

1. A method of copper-plating a material which comprises performing electrolysis using an electrolytic plating cell which has been separated by a diaphragm into an anode chamber having therein an insoluble metal electrode as an anode and a cathode chamber having therein the material to be plated as a cathode, and further using as an electrolyte a solution containing copper ions and an additive, said electrolyte being fed to the cathode chamber in a manner such that copper ion concentration in the electrolyte within the cathode chamber is kept constant and further being fed to the anode chamber at a rate of from about 0.2 to 11 ml/KAh.

2. A method as in claim 1, wherein the feeding of the electrolyte to the anode chamber is effected by means of natural circulation through a pore provided in an anode chamber wall.

3. A method as in claim 1, wherein said anode is selected from the group consisting a platinum group metal-coated electrode, a platinum group metal oxide-coated electrode and a lead electrode.

4. A method as in claim 1, wherein said anode comprises an iridium oxide-coated electrode.

5. A method as in claim 1, wherein said diaphragm has opening sizes of 10 μm or less.

6. A method as in claim 1, wherein said additive is selected from the group consisting of a 1,3-dioxolan polymer, a poly(propylene glycol), a poly(propylene propanol), an organosulfur compound and a phenazone dye.

7. A method as in claim 1, wherein electrolysis is performed at about 0.1–3.0 A/l, an applied voltage of 1.5–6.0 V, an anode electric current density of 1–10 A/dm$^2$, a cathode electric current density of 1–10 A/dm$^2$, and an electrolyte temperature of 15°–35° C.

8. A method as in claim 1, wherein said cathode comprises a printed-circuit substrate material.

9. A method as in claim 1, wherein said cathode comprises a composite board containing a synthetic resin based material and a thin copper foil covering said synthetic resin base material and having a plurality of through-holes in predetermined positions.

10. A method as in claim 1, wherein said cathode is first provided with a metal film coating by electroless plating, and then providing an additional metal film coating thereover by performing electrolysis to electroplate said cathode.

* * * * *